(12) United States Patent
Fitzpatrick et al.

(10) Patent No.: US 9,146,850 B2
(45) Date of Patent: Sep. 29, 2015

(54) DATA STORAGE SYSTEM WITH DYNAMIC READ THRESHOLD MECHANISM AND METHOD OF OPERATION THEREOF

(71) Applicant: SMART Storage Systems, Inc., Chandler, AZ (US)

(72) Inventors: James Fitzpatrick, Sudbury, MA (US); Mark Dancho, Chandler, AZ (US); James M. Higgins, Chandler, AZ (US); Robert W. Ellis, Phoenix, AZ (US)

(73) Assignee: SMART STORAGE SYSTEMS, INC., Milipitas, CA (US)

( * ) Notice: Subject to any disclaimer, the term of this patent is extended or adjusted under 35 U.S.C. 154(b) by 103 days.

(21) Appl. No.: 13/957,407

(22) Filed: Aug. 1, 2013

(65) Prior Publication Data
US 2015/0039842 A1   Feb. 5, 2015

(51) Int. Cl.
| | | |
|---|---|---|
| G06F 12/00 | (2006.01) | |
| G11C 11/56 | (2006.01) | |
| G11C 16/06 | (2006.01) | |
| G11C 16/26 | (2006.01) | |
| G11C 16/34 | (2006.01) | |

(52) U.S. Cl.
CPC ............ *G06F 12/00* (2013.01); *G11C 11/5642* (2013.01); *G11C 16/06* (2013.01); *G11C 16/26* (2013.01); *G11C 16/349* (2013.01); *G11C 16/3454* (2013.01)

(58) Field of Classification Search
None
See application file for complete search history.

(56) References Cited

U.S. PATENT DOCUMENTS

| | | | |
|---|---|---|---|
| 4,048,481 | A | 9/1977 | Bailey, Jr. et al. |
| 4,839,587 | A | 6/1989 | Flatley et al. |
| 5,034,744 | A | 7/1991 | Obinata |
| 5,210,854 | A | 5/1993 | Beaverton et al. |
| 5,311,395 | A | 5/1994 | McGaha et al. |
| 5,450,354 | A | 9/1995 | Sawada et al. |
| 5,479,638 | A | 12/1995 | Assar et al. |
| 5,784,174 | A | 7/1998 | Fujino et al. |
| 5,790,828 | A | 8/1998 | Jost |
| 5,930,504 | A | 7/1999 | Gabel |
| 5,949,785 | A | 9/1999 | Beasley |

(Continued)

FOREIGN PATENT DOCUMENTS

| | | |
|---|---|---|
| EP | 1 956 489 A2 | 8/2008 |
| EP | 1 990 921 A2 | 11/2008 |

(Continued)

OTHER PUBLICATIONS

Ulinktech, "ATA Command Table (in Alphabetic Order)," Feb. 6, 2011, https://web.archive.org/web/20110206060820/http://www.ulinktech.com/downloads/AT, 6 pages.

(Continued)

*Primary Examiner* — Duc Doan
(74) *Attorney, Agent, or Firm* — Morgan, Lewis & Bockius LLP

(57) ABSTRACT

A system and method of operation of a data storage system includes: a memory die for determining a middle read threshold; a control unit, coupled to the memory die, for calculating a lower read threshold and an upper read threshold based on the middle read threshold and a memory element age; and a memory interface, coupled to the memory die, for reading a memory page of the memory die using the lower read threshold, the middle read threshold, or the upper read threshold for compensating for a charge variation.

20 Claims, 7 Drawing Sheets

(56) References Cited

U.S. PATENT DOCUMENTS

| | | |
|---|---|---|
| 5,963,983 A | 10/1999 | Sakakura et al. |
| 6,034,897 A | 3/2000 | Estakhri et al. |
| 6,069,827 A | 5/2000 | Sinclair |
| 6,091,652 A | 7/2000 | Haehn et al. |
| 6,275,436 B1 | 8/2001 | Tobita et al. |
| 6,345,367 B1 | 2/2002 | Sinclair |
| 6,356,447 B2 | 3/2002 | Scafidi |
| 6,381,670 B1 | 4/2002 | Lee et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,728,913 B1 | 4/2004 | Parker |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,871,304 B2 | 3/2005 | Hadjihassan et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,243,186 B2 | 7/2007 | Liang et al. |
| 7,298,888 B2 | 11/2007 | Hamar |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,693,422 B2 | 4/2010 | Alicherry et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,979,614 B1 | 7/2011 | Yang |
| 8,000,135 B1 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,259,506 B1 | 9/2012 | Sommer et al. |
| 8,289,801 B2 | 10/2012 | Smith et al. |
| 8,296,534 B1 | 10/2012 | Gupta et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,386,700 B2 | 2/2013 | Olbrich et al. |
| 8,386,860 B2 | 2/2013 | Tseng et al. |
| 8,407,409 B2 | 3/2013 | Kawaguchi |
| 8,464,106 B2 | 6/2013 | Filor et al. |
| 8,503,238 B1 | 8/2013 | Wu et al. |
| 8,601,203 B2 | 12/2013 | Holbrook et al. |
| 8,612,669 B1 | 12/2013 | Syu et al. |
| 8,612,804 B1 | 12/2013 | Kang et al. |
| 8,661,184 B2 | 2/2014 | Wood et al. |
| 8,694,811 B2 | 4/2014 | Raju et al. |
| 8,832,506 B2 | 9/2014 | Griffin et al. |
| 8,984,216 B2 | 3/2015 | Fillingim |
| 2002/0056025 A1 | 5/2002 | Qiu et al. |
| 2002/0156891 A1 | 10/2002 | Ulrich et al. |
| 2002/0159285 A1 | 10/2002 | Morley et al. |
| 2003/0033308 A1 | 2/2003 | Patel et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2004/0080985 A1 | 4/2004 | Chang et al. |
| 2004/0088511 A1 | 5/2004 | Bacon et al. |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0076102 A1 | 4/2005 | Chen et al. |
| 2005/0144516 A1 | 6/2005 | Gonzalez et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0080505 A1 | 4/2006 | Arai et al. |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0050536 A1 | 3/2007 | Kolokowsky |
| 2007/0061511 A1 | 3/2007 | Faber |
| 2007/0067598 A1 | 3/2007 | Fujimoto |
| 2007/0079152 A1 | 4/2007 | Winick et al. |
| 2007/0083779 A1 | 4/2007 | Misaka et al. |
| 2007/0226592 A1 | 9/2007 | Radke |
| 2007/0234004 A1 | 10/2007 | Oshima et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0082736 A1 | 4/2008 | Chow et al. |
| 2008/0126720 A1 | 5/2008 | Danilak |
| 2008/0183918 A1 | 7/2008 | Dhokia et al. |
| 2008/0189588 A1 | 8/2008 | Tanaka et al. |
| 2008/0263289 A1 | 10/2008 | Hosoya et al. |
| 2008/0313505 A1 | 12/2008 | Lee et al. |
| 2009/0006900 A1 | 1/2009 | Lastras-Montano et al. |
| 2009/0019321 A1 | 1/2009 | Radke |
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1 | 4/2009 | Ye et al. |
| 2009/0125670 A1 | 5/2009 | Keays |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1 | 6/2009 | Choi et al. |
| 2009/0172262 A1 | 7/2009 | Olbrich et al. |
| 2009/0179707 A1 | 7/2009 | Higashino |
| 2009/0228634 A1 | 9/2009 | Nakamura et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |

(56) References Cited

U.S. PATENT DOCUMENTS

| | | |
|---|---|---|
| 2009/0300238 A1 | 12/2009 | Panabaker et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0099342 A1 | 4/2011 | Ozdemir |
| 2011/0107144 A1 | 5/2011 | Ohara |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1 | 6/2011 | Weingarten |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1 | 3/2012 | Naeimi |
| 2012/0096217 A1 | 4/2012 | Son et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1 | 12/2012 | Suzuki et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0073788 A1 | 3/2013 | Post et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0238833 A1 | 9/2013 | Vogan et al. |
| 2013/0265825 A1 | 10/2013 | Lassa |
| 2013/0332791 A1 | 12/2013 | Chu |
| 2014/0036589 A1 | 2/2014 | Parthasarathy et al. |
| 2014/0059359 A1 | 2/2014 | Bahirat |
| 2014/0108891 A1 | 4/2014 | Strasser et al. |
| 2014/0129874 A1 | 5/2014 | Zaltsman et al. |
| 2014/0158525 A1 | 6/2014 | Greene |
| 2014/0208174 A1 | 7/2014 | Ellis et al. |
| 2014/0372777 A1 | 12/2014 | Reller et al. |

FOREIGN PATENT DOCUMENTS

| | | |
|---|---|---|
| EP | 2 498 259 A2 | 9/2012 |
| JP | 2012129859 A | 7/2012 |
| WO | WO 2009/042298 A1 | 4/2009 |
| WO | WO 2011/156466 | 12/2011 |

OTHER PUBLICATIONS

International Search Report dated Mar. 25, 2014, received in International Patent Application No. PCT/US2013/072400, which corresponds to U.S. Appl. No. 13/690,337, 3 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

International Search Report and Written Opinion dated Aug. 22, 2014, received in International Patent Application No. PCT/US2014/032978, which corresponds to U.S. Appl. No. 14/081,992, 10 pages (Ellis).

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solid State Disks," 7th International Conference on Emerging Technologies (ICET), Sep. 5, 2011, 6 pages.

Tai et al, "Prolongation of Lifetime and the Evaluation Method of Dependable SSD," 25 International Symposium on Defect and Fault Tolerance in VLSI Systems, 2010, NJ, USA, 8 pages.

Yimo et al., "WeLe-RAID: A SSD-Based RAID for System Endurance and Performance," Jan. 2011, Network and Parallel Computing, Springer, 14 pages.

International Search Report and Written Opinion dated Jan. 9, 2015, received in International Patent Application No. PCT/US2014/049731, which corresponds to U.S. Appl. No. 14/334,324, 9 pages (Fitzpatrick).

International Search Report and Written Opinion dated Feb. 18, 2015, received in International Patent Application No. PCT/US2014/065401, which corresponds to U.S. Appl. No. 14/082,031, 9 pages (Higgins).

International Search Report dated Apr. 15, 2014, received in International Patent Application No. PCT/US2013/078340, which corresponds to U.S. Appl. No. 13/746,542, 11 pages (Ellis).

Gal et al., "Algorithms and Data Structures for Flash Memories", "ACM Computing Surveys", Jun. 2005, pp. 1-30, vol. 37, No. 2, Publisher: ACM, Published in: NY, NY, US.

(56) References Cited

OTHER PUBLICATIONS

Cooke, "Introduction to Flash Memory (T1A)", "Flash Memory Summit", Aug. 22, 2008, p. 102, Publisher: Micron Technology, Inc., Published in: Santa Clara, CA, US.
Spanjer, "Flash Management—Why and How?", "Smart Modular Technologies", Nov. 2009, pp. 2-13, Retrieved from: http://www.scantec.de/fileadmin/pdf/Smart_Modular/Flash-Management.pdf on Jul. 23, 2013.
O'Brien, "SMART Storage Systems Optimus SAS Enterprise SSD Review," SMART Storage Systems, Oct. 9, 2012, 44 pages.
IBM Corporation, "Systems Management, Work Management," Version 5, Release 4, 9th Edition, Feb. 2006, pp. 1-21.
Texas Instruments, "Power Management IC for Digital Set Top Boxes," SLVSA10A, Sep. 2009, pp. 1-22.
International Search Report and Written Opinion dated Dec. 20, 2013, received in PCT/US2013/045282, which corresponds to U.S. Appl. No. 13/493,949, 7 pages (Ellis).
Internationai Search Report and Written Opinion dated Jun. 12, 2014, received in PCT/US2014/018972, which corresponds to U.S. Appl. No. 13/779,352, 12 pages (Schmier).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Tseng et al., "Understanding the Impact of Power Loss on Flash Memory," DAC'11, Jun. 5-10, 2011, San Diego, California, 6 pages.
International Search Report and Written Opinion dated Nov. 7, 2014, received in International Patent Application No. PCT/US2014/049732, which corresponds to U.S. Appl. No. 14/334,350, 13 pages (Fitzpatrick).
International Search Report and Written Opinion dated Oct. 17, 2014, received in International Patent Application No. PCT/US2014/049734, which corresponds to U.S. Appl. No. 14/332,259, 8 pages (Higgins).
International Search Report and Written Opinion dated Oct. 23, 2014, received in International Patent Application No. PCT/US2014/049736, which corresponds to U.S. Appl. No. 14/446,249, 8 pages (Fitzpatrick).
International Search Report and Written Opinion dated Nov. 5, 2014, received in International Patent Application No. PCT/US2014/049282, which corresponds to U.S. Appl. No. 13/957,407, 12 pages (Fitzpatrick).

DATA STORAGE SYSTEM WITH DYNAMIC READ THRESHOLD MECHANISM AND METHOD OF OPERATION THEREOF

TECHNICAL FIELD

The present invention relates generally to a data storage system and more particularly to a system with a dynamic read threshold mechanism.

BACKGROUND ART

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electromechanical hard disks have become feasible for use in computers. NOT-AND (NAND) flash is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of Single Level Cell (SLC) or more than two logical states in the case of Multi Level Cell (MLC).

A flash memory cell is light in weight, occupies very little space, and consumes less power than electromechanical disk drives. Construction of a storage system with this type of memory allows for much higher bandwidths and input/output operations per second (IOPS) than typical electromechanical disk drives. More importantly, it is especially rugged and can operate at a much high temperature range. It will withstand without adverse effects repeated drops, each of which would destroy a typical electromechanical hard disk drive. A problem exhibited by flash memory is that it tends to have a limited life in use.

Thus, a need still remains for better data management devices. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a data storage system, including: determining a middle read threshold for a memory die; calculating a lower read threshold and an upper read threshold based on the middle read threshold and a memory element age; and reading a memory page of the memory die using the lower read threshold, the middle read threshold, or the upper read threshold for compensating for a charge variation.

The present invention provides a data storage system, including: a memory die for determining a middle read threshold; a control unit, coupled to the memory die, for calculating a lower read threshold and an upper read threshold based on the middle read threshold and a memory element age; and a memory interface, coupled to the memory die, for reading a memory page of the memory die using the lower read threshold, the middle read threshold, or the upper read threshold for compensating for a charge variation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
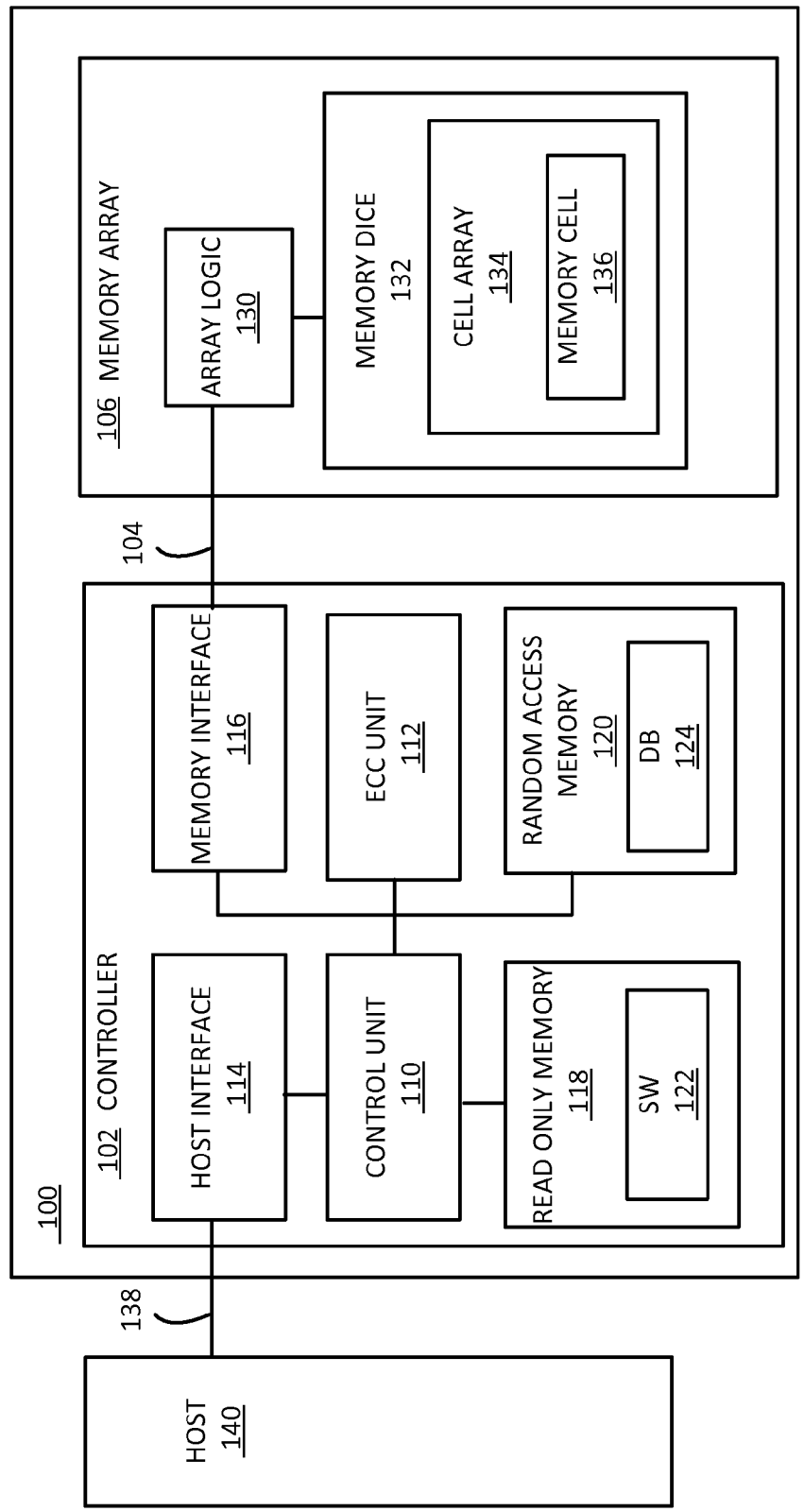
FIG. 1 is a block diagram of a data storage system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, passive devices, or a combination thereof.

Referring now to FIG. 1, therein is shown a block diagram of a data storage system 100 in an embodiment of the present invention. The data storage system 100 includes memory array 106 coupled to a controller 102 via a memory bus 104

The controller 102 is a processing unit for managing the storage and retrieval of data in the memory array 106. The controller 102 can be an embedded processor, control logic, or a combination thereof. The controller 102 can transfer stored data from the memory array 106 to a host device 140.

The memory array 106 is a non-volatile memory units for storing data. The memory array 106 can include NOT-AND (NAND) flash memory arrays, NOT-OR (NOR) flash memory arrays, other non-volatile memory arrays, or a combination thereof.

The memory array 106 can be formed with memory dice 132. The memory dice 132 are semiconductor devices for storing information. The memory dice are the minimum unit that can independently execute commands and report status. For example, the memory dice 132 can be flash memory devices, NAND flash memory chips, NOR flash memory devices, or a combination thereof.

The memory bus 104 is a communication channel. The memory bus 104 conveys data and control information between the controller 102 and the memory array 106.

The memory dice 132 can include a cell array 134. The cell array 134 is a set of non-volatile flash memory cells for storing data. For example, the cell array 134 can include a single-level cell flash (SLC) memory, a multi-level cell (MLC) flash memory, a mixed functionality cell, or a combination thereof.

The cell array 134 can include memory cells 136. The memory cells 136 are electronic structures for storing information. For example, the memory cells 136 can be floating gate flash memory devices.

The memory array 106 can include an array logic unit 130 coupled to the cell array 134. The array logic unit 130 is circuitry to provide addressing, data transfer and sensing, and other support to control the memory array 106 for saving and retrieving information from the cell array 134.

The controller 102 can include a memory interface 116 coupled to the memory array 106. The memory interface 116 can include circuitry for communicating with the memory array 106 over the memory bus 104.

The controller 102 can include a control unit 110 coupled to the memory interface 116 and a host interface 114. A read only memory 118 can be coupled to the control unit 110. A random access memory 120 can be coupled to the control unit 110 and to the read only memory 118. The random access memory 120 can be utilized as a buffer memory for temporary storage of data being written to or read from the memory array 106.

The random access memory 120 can include a controller database 124. The controller database 124 is a data storage and retrieval system. The controller database 124 can be used to store read threshold information.

The read only memory 118 can include a software 122 for operating the control unit 110. The software 122 is executable code for implementing the intelligence of the data storage system 100.

The controller 102 can include an error correction code unit 112 coupled to the control unit 110. The error correction code unit 112 is a processing hardware for calculating an error correction code value that can be used to detect errors, correct errors, or a combination thereof in data stored or transmitted from the memory array 106.

The error correction code unit 112 can calculate one or more error correction code values using different methods such as a Reed-Solomon code, a Hamming code, a Bose-Chauduri-Hocquenghem (BCH) code, or a combination thereof. Although the error correction code unit 112 is a dedicated element for calculating error correction codes, it is understood that error correction codes can also be calculated in other ways, such as using the control unit 110 to calculate error correction codes.

The controller 102 can include the host interface 114 coupled to the host device 140 via a digital connection 138. The host device 140 is a computing device that can use the data storage system 100 for storing data. For example, the host device 140 can be a laptop computer, a desktop computer, a server, a smart phone, or a combination thereof.

The host interface 114 can communicate commands and data between the host device 140 and the controller 102 with the digital connection 138. For example, the host interface 114 can detect a connection to the host device 140 and generate command based on the connection to the host device 140.

The data storage system 100 can be connected to the host device 140 with the digital connection 138. The digital connection 138 is a communication link for transferring digital information between the data storage system 100 and the host device 140.

The digital connection 138 can be formed in a variety of ways. For example, the digital connection 138 can be a universal serial bus (USB) connection for transferring information. In another example, the digital connection 138 can be a wireless communication mechanism, such as Wireless Fidelity (Wi-Fi), infrared communication mechanism, optical communication system, near field communication system, or a combination thereof.

Figure 2:
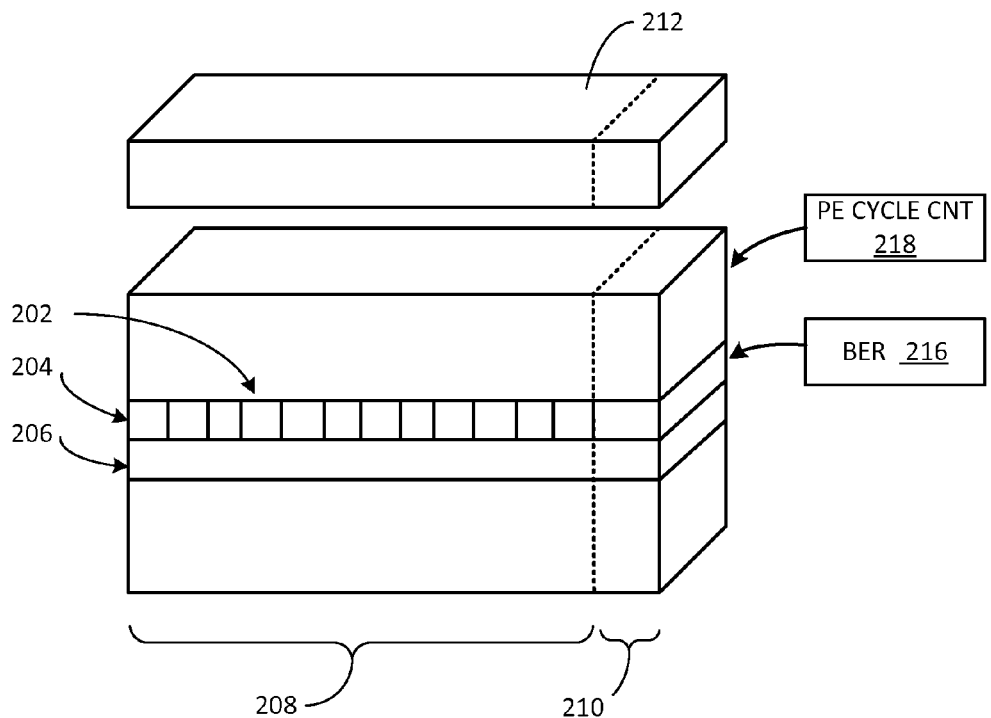
FIG. 2 is an example of a memory diagram of the data storage system.

Referring now to FIG. 2, therein is shown an example of a memory diagram of the data storage system 100 of FIG. 1. The memory diagram shows the data storage system 100 including memory pages 202, memory blocks 204, and a data register 212. The data storage system 100 can be formed using the memory dice 132 of FIG. 1. The memory dice 132 include the memory cells 136 of FIG. 1 for storing data.

The data storage system 100 can have a variety of storage capacities determined by the number of the memory dice 132 used to form the data storage system 100. For example, the data storage system 100 can include 2 gigabytes (GB) of flash memory, 8 GB, 16 GB, or other memory sizes.

The data storage system 100 can include a number of the memory blocks 204. The memory blocks 204 are portions of the memory array 106 of FIG. 1. For example, the data storage system 100 with capacity of 2 GB can have 4,096 of the memory blocks 204.

The memory blocks 204 can include erase blocks 206. The erase blocks 206 are the smallest unit of memory that can be erased as a single entity at one time.

Each of the erase blocks 206 can have a program erase cycle count 218. When one of the erase blocks 206 is erased, then the program erase cycle count 218 can be incremented. The program erase cycle count 218 can be used to represent the age or level of wear of one of the memory blocks 204. The program erase cycle count 218 is a measure of the level of usage within one of the erase blocks 206. The flash memory devices, such as NAND flash, have a limited number of useful program erase cycles.

The memory blocks 204 can be divided into the memory pages 202. The memory pages 202 are the smallest group of data bytes that can be read or written in the data storage system 100. The memory pages 202 are the smallest addressable unit of memory that can be programmed. For example, each of the memory blocks 204 can have 64 of the memory pages 202.

The memory pages 202 include a data area 208 and a spare area 210. The data area 208 is a group of memory cells used to store user data. The data area 208 can be various sizes. For example, the data area 208 of one of the memory pages 202 can be 2,048 bytes.

The spare area 210 is a group of memory cells to store metadata about the data area 208. For example, the spare area 210 can include error correction code information, status information, or a combination thereof. The spare area 210 can have a variety of sizes. For example, the spare area 210 can be 128 bytes. The memory pages 202 can have a size of 4,224 bytes for the data area 208 and the spare area 210.

The memory array 106 of FIG. 1 can be updated by erasing the memory blocks 204 and programming new data into the memory blocks 204 that have been erased. Programming the memory blocks 204 writes data into the memory blocks 204.

Reading one of the memory pages 202 can result in reading errors where one or more of the bits in the memory pages 202 is incorrect. The number of individual bit errors in a stream of data is described as a bit error rate 216. The bit error rate 216 (BER) is defined as numbers of incorrect bits in a data stream stored in the data storage system 100. The incorrect bits can be detected within a code word protected by an error-correcting code (ECC).

The code word refers to a group of data bytes covered by a single instance of multiple ECC parity words. The error-correcting code refers to parity or redundant data generated over a set of host or user data grouped into the code word. The bit error rate 216 is the number of incorrect bits in a data stream stored in the flash memory.

Figure 3:
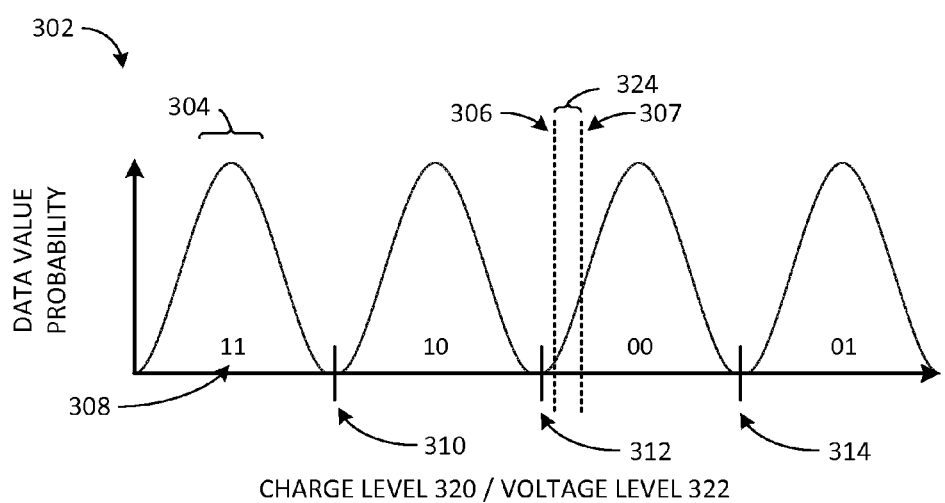
FIG. 3 is an example of a charge profile graph.

Referring now to FIG. 3, therein is shown an example of a charge profile graph 302. The charge profile graph 302 can indicate the probability of charge levels 320 representing data values 308 in the memory cells 136 of FIG. 1, such as a multi-level cell flash memory device.

The memory cells 136, such as a multi-level cell flash memory device, can represent n bits of data by $2^n-1$ different values of voltage levels 322. The amount of charge stored in the memory cells 136 can indicate the data values 308 stored by the MLC flash memory device.

The charge levels 320 can also be represented by the voltage levels 322. For example, the voltage levels 322, designed as voltage threshold levels or Vth, can be voltage settings applied to internal NAND flash memory device comparators which determine the data values 308 stored in the flash memory devices.

In an illustrative example, each of the data values 308 represented by the memory cells 136, such as MLC flash memory cells, can have different read thresholds. The read thresholds can correspond to one of a group of charge windows 304. The read thresholds are the voltage or charge levels that map to one of the data values 308.

The read thresholds can be dynamically modified by the data storage system 100 of FIG. 1 as the voltage levels 322 representing the data values 308 change. The memory cells 136 can be assigned adjusted read thresholds 306. The adjusted read thresholds 306 are the value of the read thresholds after being adjusted.

Each of the memory pages 202 of FIG. 2 have current read thresholds 307. The current read thresholds 307 are the values currently used to read the data values 308 from the memory pages 202.

The charge windows 304 are a range of charge values representing one of the data values 308. The charge windows 304 are commonly defined by read threshold voltages, such as the voltage levels 322, identifying the boundaries distinguishing the data values 308 of the one of the memory cells 136 of FIG. 1.

The data storage system 100 can determine the data values 308 based on the read thresholds in a variety of ways. For example, the data storage system 100 can include three of the read thresholds to determine four of the data values 308. The read thresholds can include a lower read threshold 310, a middle read threshold 312, and an upper read threshold 314.

The first data value can be represented by the voltage levels 322 having a value below the lower read threshold 310. The second data value can be represented by the voltage levels 322 having values greater than or equal to the lower read threshold 310 and below the middle read threshold 312.

The third data value can be represented by the voltage levels 322 greater than or equal to the middle read threshold 312 and below the upper read threshold 314. The fourth data value can be represented by the voltage levels 322 greater than or equal to the upper read threshold 314.

The first data value can represent a binary value of "11". The second data value can represent a binary value of "10". The third data value can represent a value of "00". The fourth data value can represent a value of "01".

The charge windows 304 for reading the data values 308 from the memory cells 136 with the fewest bit errors are not constant. The charge windows 304 with the optimum results shifts as a function of many variables including retention time, number of reads of nearby cells, temperature, program erase cycles, wear, dwell time between program erase cycles, or a combination thereof.

Each of the charge levels 320 representing the data values 308 can change over time. Thus, changing the read thresholds can result in improved read accuracy by compensating for the charge variations 324 in the memory elements cause by time and usage. The charge variations 324 are the changes in charge over time for one of the memory elements. The charge variations 324 can include leakage, interaction with adjacent memory elements, or a combination thereof.

As the charge levels 320 change with the charge variations 324, the bit error rate 218 of FIG. 2 can increase. Modifying the read thresholds to values that more accurately represent the current values of the charge levels 320 for the data values 308 can reduce the bit error rate 218 for reading information from the memory elements. For example, the lower read threshold 310 can be modified to be closer to the equivalent values for the charge levels 320 to reduce the bit error rate 218.

The adjusted read thresholds 306 can describe various read thresholds. For example, the adjusted read thresholds 306 can include the lower read threshold 310, the middle read threshold 312, and the upper read threshold 314.

In an illustrative example, some solid-state storage devices (SSD), such as previous generation and low-cost SSDs of the current generation, do not manage the read thresholds for reading the data values 308 from the MLC flash memory devices. Such devices use the read thresholds that have been pre-defined using the NAND-flash memory manufacturer's factory-time configuration.

In another example, error correction codes (ECC) are written along with the data to correct read errors due to non-optimal voltage windows. However, the read thresholds vary over flash life, so using constant read thresholds is non-optimal, especially toward end of life.

Current generation of the data storage system 100 actively manage the read thresholds. However, the data storage system 100 can consist of over a trillion NAND flash cells, and each cell's optimal read thresholds can vary compared to other cells. Therefore, optimizing the read thresholds for the data storage system 100 requires adjustment of the read thresholds and the appropriate scheduling of read adjustment operations.

Figure 4:
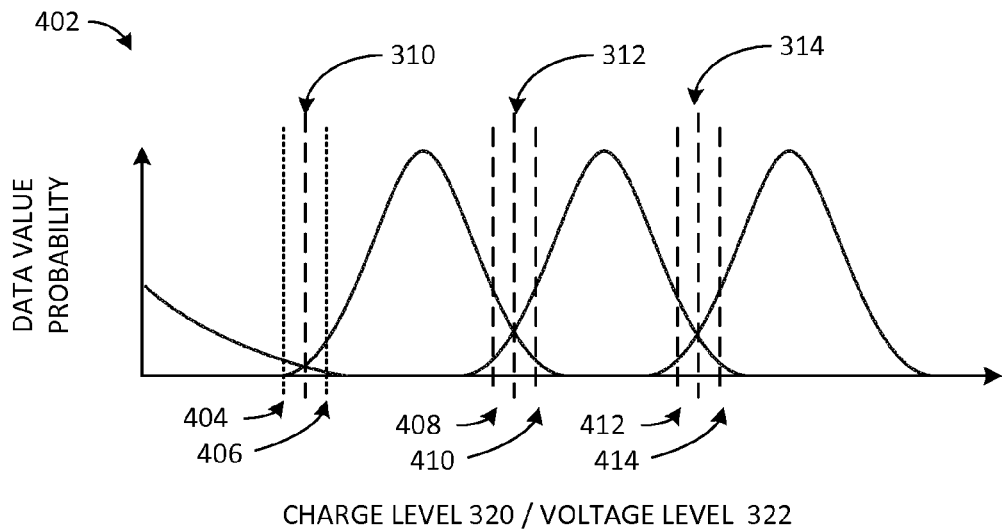
FIG. 4 is an example of a charge profile threshold graph.

Referring now to FIG. 4, therein is shown an example of a charge profile threshold graph 402. The charge profile threshold graph 402 shows the probability of determining one of the data values 308 of FIG. 3 against the charge levels 320. The charge levels 320 can also be represented by the voltage levels 322. The charge profile threshold graph 402 can indicate the probability of determining the data values 308 represented by different read thresholds.

The charge profile threshold graph 402 can include a minimum lower threshold 404 and a maximum lower threshold 406 for representing the ends of a range of the voltage levels 322 for the lower read threshold 310. The minimum lower threshold 404 and the maximum lower threshold 406 can be used to read one of the memory cells 136 of FIG. 1 to detect the lower read threshold 310 representing one of the data values 308 of FIG. 3.

The minimum lower threshold 404 can represent a lower limit of the bit error rate 216 of FIG. 2 for the first data value. For example, the minimum lower threshold 404 can be used for retrieving the data values 308 with the bit error rate 216 above a pre-determined threshold.

Similarly, the charge profile threshold graph 402 can represent a minimum middle threshold 408 and a maximum middle threshold 410 for each of the voltage levels 322 representing the middle read threshold 312. The charge profile threshold graph 402 can also represent a minimum upper threshold 412 and a maximum upper threshold 414 for each of the voltage levels 322 representing the upper read threshold 314.

For example, the charge profile threshold graph 402 can include the minimum middle threshold 408, the maximum middle threshold 410, the minimum upper threshold 412, and the maximum upper threshold 414. In another example, the data values 308 can be determined by performing multiple read operations with different sets of the lower read threshold 310 and the upper read threshold 314.

In an illustrative example, if one of the memory cells 136 has three of the read thresholds, then each of the adjusted read thresholds 306 of FIG. 3 can be determined by calculating a maximum and minimum read threshold to determine which of the read thresholds produces a lower value of the bit error rate 216.

Figure 5:
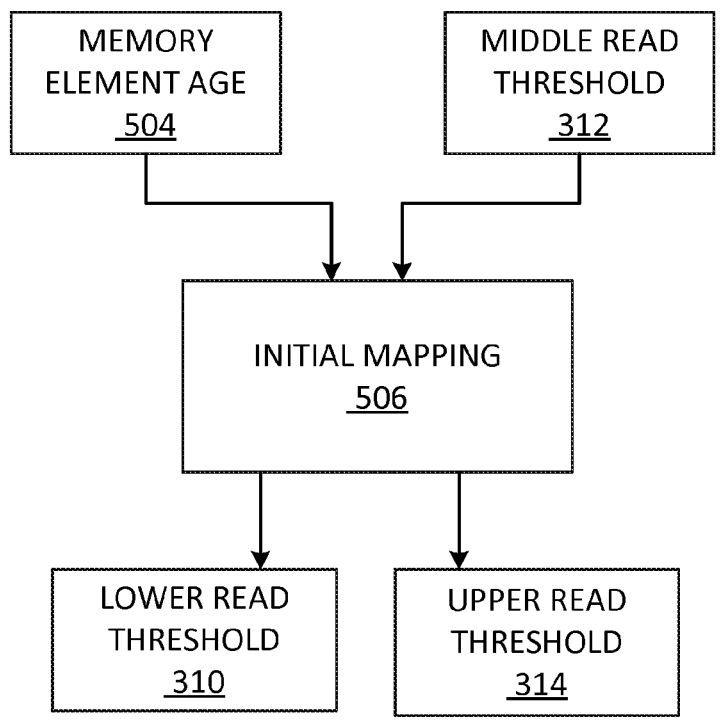
FIG. 5 is an example of a current read threshold process.

Referring now to FIG. 5, therein is shown an example of a current read threshold process 502. The current read threshold process 502 can determine the adjusted read thresholds 306 of FIG. 3 for one of the memory dice 132 of FIG. 1 of the data storage system 100 of FIG. 1. The current read threshold process 502 can be implemented as the software 122 of FIG. 1 executing on the control unit 110 of FIG. 1.

The current read threshold process 502 can determine the lower read threshold 310 of FIG. 3, the middle read threshold 312 of FIG. 3, and the upper read threshold 314 of FIG. 3 for one of the memory dice 132. The lower read threshold 310, the middle read threshold 312, and the upper read threshold 314 can be used to determine the data values 308 of FIG. 3.

The current read threshold process 502 includes an initial mapping module 506. The initial mapping module 506 can first determine the middle read threshold 312 and retrieve a memory element age 504 from the controller database 124 of FIG. 1.

The memory element age 504 is a value indicating the level of usage of a memory element. For example, the memory element age 504 can be the total number of program erase cycle for one of the memory blocks 204 of FIG. 2. In another example, the memory element age 504 can be calendar age, effective age, or a combination thereof.

There are numerous methods for measuring the memory element age 504. For example, the memory element age 504 can be the program erase cycle counts, bit error rates, program time, optimal read threshold, erase time, or a combination thereof. The memory element age 504 is an estimate of the wear on the flash memory element.

The memory element age 504 can represent a variety of memory elements. For example, the memory element age 504 can include the age of one of the memory dice 132, one of the memory blocks 204, one of the memory pages 202 of FIG. 2, or one of the memory cells.

After receiving the memory element age 504 and the middle read threshold 312, the initial mapping module 506 can calculate the lower read threshold 310 and the upper read threshold 314. The lower read threshold 310 and the upper read threshold 314 can be calculated based on the memory element age 504 and the value of the middle read threshold 312. For example, the lower read threshold 310 and the upper read threshold 314 can calculated using an experimentally determined adaptation offset based on the change of the adjusted read thresholds 306 as the number of program and erase cycles increases.

The middle read threshold 312 can be determined by experimentally by testing the data storage system 100 of FIG. 1 and identifying the value for the middle read threshold 312 that provides the second data value within the bit error rate 216 of FIG. 2 that is desired. The middle read threshold 312 can be experimented calculated for each of the memory dice 132.

The lower read threshold 310 and the upper read threshold 314 can be calculated based on the middle read threshold 312 and the memory element age 504. The memory element age 504 is a calculated value representing the effective age and usage of one of the memory dice 132.

The memory element age 504 can be calculated in a variety of ways. For example, the memory element age 504 can be the number of the program erase cycle count 218 of FIG. 2, calendar age, or a combination thereof.

It has been found that the current read threshold process 502 can improved the adjusted read thresholds 306 information for the operation of the data storage system 100. The current read threshold process 502 can determine a priori knowledge of the read threshold values of the flash memory device based on external experimental characterization results as a function of the memory element age 504 and one of the read thresholds. Calculating the lower read threshold 310 and the upper read threshold 314 based on the memory element age 504 and the middle read threshold 312 is faster than evaluating the lower read threshold 310 and the upper read threshold 314 experimentally and reduces the overall time required to determine the read thresholds.

Because determining the optimal value of the read thresholds of each of the memory cells 136 of FIG. 1 has variable costs, it is simpler to determine the optimal value of the middle read threshold 312 than the optimal values of the lower read threshold 310 and the upper read threshold 314.

It has been discovered that determining the lower read threshold 310 and the upper read threshold 314 as a function of the memory element age 504 and the middle read threshold 312 can increase processing speed. By experimentally determining the middle read threshold 312, the lower read threshold 310 and the upper read threshold 314 can be calculated using the memory element age 504. This reduces the time otherwise required to determine the lower read threshold 310 and the upper read threshold 314 experimentally by measuring the response from the memory cells 136. Calculating the lower read threshold 310 and the upper read threshold 314 using the memory element age 504 and the middle read threshold 312 is significantly faster than a brute force measurement method.

Figure 6:
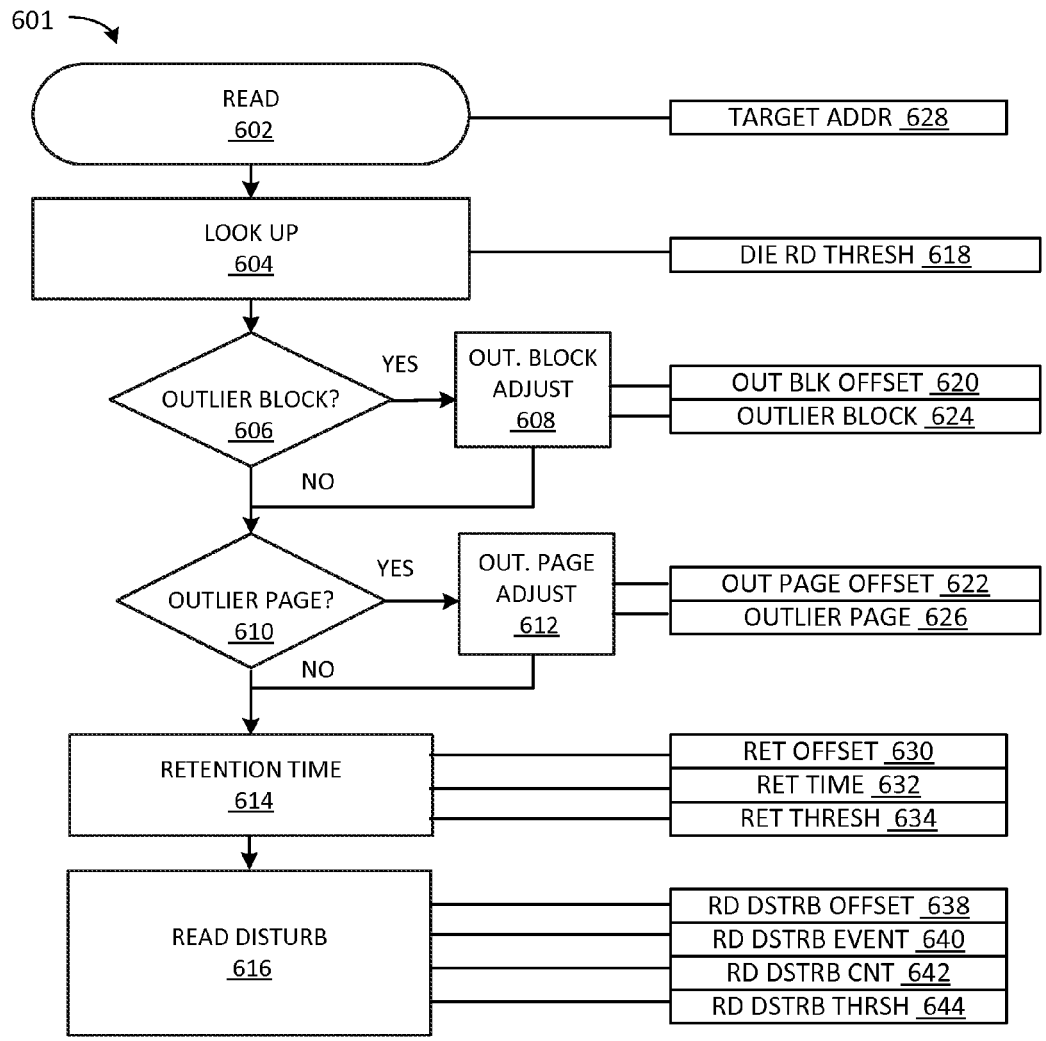
FIG. 6 is an example of an outlier adjustment process.

Referring now to FIG. 6, therein is shown an example of an outlier adjustment process 601. The outlier adjustment process 601 can determine the change in the lower read threshold 310 of FIG. 3, the middle read threshold 312 of FIG. 3, and the upper read threshold 314 of FIG. 3 for the memory blocks 204 of FIG. 2 and the memory pages 202 of FIG. 2 within one of the memory dice 132 of FIG. 1. The outlier adjustment process 601 can also adjust the lower read threshold 310, the middle read threshold 312, and the upper read threshold 314 of the memory blocks 204 and the memory pages 202 based on the retention time, the number of read disturb events, and the number of program erase cycles.

An outlier block offset 620 is a value representing the change in the adjusted read thresholds 306 of FIG. 3, such as the lower read threshold 310, the middle read threshold 312, and the upper read threshold 314, for outlier blocks 624. An outlier page offset 622 is a value representing the expected change in the read thresholds for outlier pages 626.

For example, the outlier block offset 620 can indicate that the read thresholds for the outlier blocks 624 can be reduced by 10%-20% if one of the outlier blocks 624 is at the edge of one of the memory dice 132.

The outlier adjustment process 601 can determine the outlier block offset 620 and the outlier page offset 622. The outlier block offset 620 can be used to adjust the read thresholds for one of the outlier blocks 624. The outlier page offset 622 can be used to adjust the read thresholds for one of the outlier pages 626.

In the outlier adjustment process 601, the read thresholds can be calculated based on the read operation status of an outlier element, such as one of the outlier blocks 624, one of the outlier pages 626, or a combination thereof. The outlier adjustment process 601 can be implemented by the software 122 of FIG. 1.

The outlier adjustment process 601 include multiple modules. The outlier adjustment process 601 can include a read module 602, a lookup module 604, an outlier block check module 606, an outlier block adjustment module 608, an outlier page check module 610, an outlier page adjustment module 612, a retention time module 614, and a read disturb module 616.

In the read module 602, the outlier adjustment process 601 can determine that a read operation is required to retrieve data from the data storage system 100 of FIG. 1. The read module 602 can include determining a target address 628 for reading the user data and identifying one of the memory pages 202, one of the memory blocks 204, and one of the memory dice 132 for the target address 628.

In the lookup module 604, the outlier adjustment process 601 can look up an optimal value for a die read thresholds 618 for the memory dice 132 of the target address 628. The die read thresholds 618 can be determined in advance and stored in the controller database 124 of FIG. 1. The die read thresholds 618 are the values of the lower read threshold 310, the middle read threshold 312, and the upper read threshold 314 for one of the memory dice 132. The die read thresholds 618 can apply to the entirety of one of the memory dice 132.

In the outlier block check module 606, the outlier adjustment process 601 can determine if the read operation requires reading one of the outlier blocks 624. If so, then the control flow can be passed to the outlier block adjustment module 608. Otherwise, the control flow can pass to the outlier page check module 610.

In the outlier block adjustment module 608, the adjusted read thresholds 306, including the lower read threshold 310, the middle read threshold 312, and the upper read threshold 314, for one of the memory blocks 204 can be modified based on the outlier block offset 620 of one of the memory blocks 204. For example, the lower read threshold 310, the middle read threshold 312, and the upper read threshold 314 can be set to the value of the outlier block offset 620.

The outlier block offset 620 represents a change in the adjusted read thresholds 306. The outlier block offset 620 can be used to for offsetting the adjusted read thresholds 306 for reading the one of the memory blocks 204. For example, the outlier block offset 620 can have a negative value if one of the memory blocks 204 has an outlier location that can result in a decrease in the charge levels 320 of FIG. 3 of the memory cells 136 of FIG. 1 of one of the memory blocks 204.

The outlier block offset 620 can be determined in a variety of ways. For example, the outlier block offset 620 of one of the memory blocks 204 can be determined by the physical location of one of the memory blocks 204 on the memory dice 132. In another example, the outlier block offset 620 of one of the memory blocks 204 can be determined by the location of one of the memory blocks 204 relative to other ones of the memory blocks 204. The outlier block offset 620 can be looked up from a pre-defined data source, dynamically evaluated, or a combination thereof.

The adjusted read thresholds 306, such as the lower read threshold 310, the middle read threshold 312, and the upper read threshold 314 of one of the memory blocks 204, can be recalculated in a variety of ways. For example, the adjusted read thresholds 306 of one of the memory blocks 204 can be determined by adding the outlier block offset 620 to the die read thresholds 618, subtracting the outlier block offset from the adjusted read thresholds 306 of one of the memory blocks 204, or a combination thereof.

In the outlier page check module 610, the outlier adjustment process 601 can determine if the read operation requires reading one of the memory pages 202. If so, then the control flow is passed to the outlier page adjustment module 612. Otherwise, the control flow can pass to the retention time module 614.

In the outlier page adjustment module 612, the adjusted read thresholds 306, such as the lower read threshold 310, the middle read threshold 312, and the upper read threshold 314, for the one of the memory pages 202 can be modified based on the outlier page offset 622 of one of the memory pages 202. For example, the lower read threshold 310, the middle read threshold 312, and the upper read threshold 314 can be set to the value of the outlier page offset 622.

The outlier page offset 622 represents a change in the adjusted read thresholds 306. The outlier page offset 622 can be used to for offsetting the adjusted read thresholds 306 for reading the one of the memory pages 202. For example, the outlier page offset 622 can have a negative value if one of the memory pages 202 has an outlier location that can result in a decrease in the charge levels 320 of the memory cells 136 of one of the memory pages 202.

The outlier page offset 622 can be determined in a variety of ways. For example, the outlier page offset 622 of one of the memory pages 202 can be determined by the physical location of one of the memory pages 202 on the memory dice 132. In another example, the outlier page offset 622 of one of the memory pages 202 can be determined by the location of one of the memory pages 202 relative to other ones of the memory pages 202. The outlier page offset 622 can be looked up from a pre-defined data source, dynamically evaluated, or a combination thereof.

The adjusted read thresholds 306 of one of the memory pages 202 can be recalculated in a variety of ways. For example, the adjusted read thresholds 306 of one of the memory pages 202 can be determined by adding the outlier page offset 622 to the die read thresholds 618, adding the outlier page offset to the adjusted read thresholds 306 of one of the memory pages 202, or a combination thereof.

In the retention time module 614, the outlier adjustment process 601 can modify the adjusted read thresholds 306, such as the lower read threshold 310, the middle read threshold 312, and the upper read threshold 314, for one of the memory blocks 204 based on a retention time 632 of the memory blocks 204. Retention is the ability of the memory cells to retain the programmed information. The retention time 632 is the amount of time the data can be stored in the flash memory devices.

The retention time 632 is a measure of the ability to store data. For example, younger-aged NAND flash memory has better data-retention capability. Older-aged NAND flash memory has worse data-retention capability.

A retention offset 630 can be calculated for one of the memory blocks 204 by determining the retention time 632 for one of the memory blocks 204. The retention offset 630 can be calculated in a variety of ways. For example, the retention offset 630 can be set to a positive value for one of the memory blocks 204 having the retention time 632 above a retention threshold 634. After the retention time module 614, the control flow can pass to the read disturb module 616.

In the read disturb module 616, the outlier adjustment process 601 can modify the adjusted read thresholds 306, such as the lower read threshold 310, the middle read threshold 312, and the upper read threshold 314, for one of the memory blocks 204 based on the number of nearby read operations that had a read disturb effect on one of the memory blocks 204. A read disturb count 642 can be incremented when a read disturb event 640 is detected. The read disturb event 640 is a change in the charge of one of the memory cells 136 when a nearby one of the memory cells 136 is read. The read operation can alter the charge of surrounding ones of the memory cells 136.

A read disturb offset 638 can be determined in a variety of ways. For example, the read disturb offset 638 can be calculated when the read disturb count 642 meets or exceeds a read disturb threshold 644. The read disturb threshold 644 is a trigger value indicating the count of the read disturb event 640 is high enough to required adjusting the adjusted read thresholds 306 of one of the memory blocks 204.

In another example, the read disturb offset 638 can be calculated by multiplying the read disturb count 642 by a constant. In yet another example, the read disturb offset 638 can be calculated by assigning a pre-determined constant value to the read disturb offset 638.

It has been discovered that adjusting the adjusted read thresholds 306 of one of the memory blocks 204 with the outlier adjustment process 601 can increase read reliability and reduce the bit error rate of the data storage system 100. By pre-determining the read threshold movement by characterizing the read results as a function of the memory age or retention time, the adjusted read thresholds 306 is modified to increase read operation accuracy.

It has been found that there is a correlation between the read thresholds among memory structures, such as the memory blocks 204 and the memory pages 202, provides simplified read threshold adjustment. The correlation reduces the amount of computation power requires to calculate the adjusted read thresholds 306 and adjustment for other related memory structure.

Outlier memory elements, such as the outlier blocks 624 and the outlier pages 626, share common characteristics such as read threshold drift across multiple components. The outlier memory elements are memory units that have different physical properties. The physical properties can include the physical location of one of the memory blocks 204 or the memory pages 202 within one of the memory dice 132. In another example, one of the memory pages 202 at the beginning of one of the memory blocks 204 can be one of the outlier memory elements.

It has been found that the adjusted read thresholds 306 having the optimal result for read operations for one of the memory blocks 204 are similar when normalized for variations in the program erase cycle count 218 of FIG. 2, read-disturb variations, and retention variation.

It has been discovered that determining the read thresholds having the optimum result for read operations on a die by die basis, and then applying adjustments for specific memory blocks based on the known program erase cycle count 218, the read disturb count 642, and the retention time 632 improves read operation performance. Performing read operations with the adjusted values for the adjusted read thresholds 306 provides more accurate read operations with fewer errors.

It has been discovered that identifying one of the outlier blocks 624 having a physical location identified as an outlier location increases the read accuracy and reduces the bit error rate 216 of FIG. 2 of the data storage system 100. By adjusting the adjusted read thresholds 306 using the read threshold offsets based on the outlier memory elements, the number of uncorrectable errors is reduced.

It has also been discovered that adjusting the adjusted read thresholds 306 of one of the memory pages 202 based on the outlier page offset 622 increases performance and reduces the bit error rate 216. By identifying specific ones of the memory pages 202 within one of the memory blocks 204 as one of the outlier pages 626 based on a physical location, the outlier page offset 622 can be calculated for one of the outlier pages 626 that are known to have predictable variation to their read thresholds.

The data storage system 100 adjusts the adjusted read thresholds 306 by applying one of the specific offsets for one of the memory blocks 204 to increase the accuracy of the read operation. This method of adjusting for a known one of the outlier pages 626 reduces errors compared to just lumping the outliers into the same group as the non-outliers, and is much faster than brute-force optimizations on each smaller group of memory elements.

Figure 7:
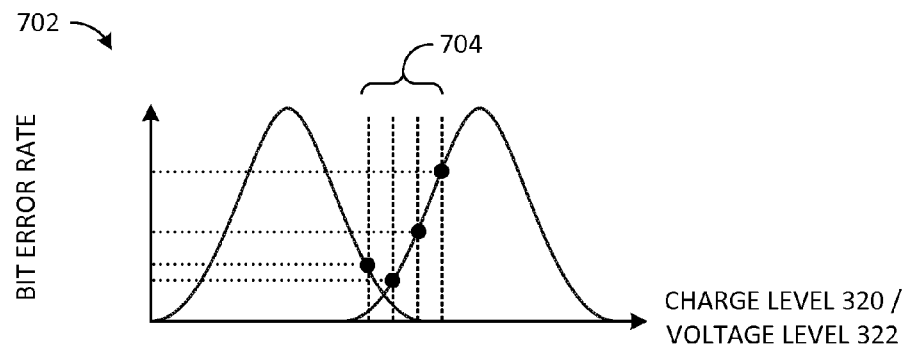
FIG. 7 is an example of a power up adaptation graph.

Referring now to FIG. 7, therein is shown an example of a power up adaptation graph 702. The read thresholds of the memory dice 132 of FIG. 1, the memory blocks 204 of FIG. 2, and the memory pages 202 of FIG. 2 can be modified when the data storage system 100 of FIG. 1 is powered up.

The power up adaptation graph 702 shows the bit error rate 216 of FIG. 2 for determining one of the data values 308 of FIG. 3 against the charge levels 320. The charge levels 320 can also be represented by the voltage levels 322. The power up adaptation graph 702 can illustrate the process for determining the optimum values for the read thresholds.

The optimum values of the voltage levels 322 for the lower read threshold 310 of FIG. 3, the middle read threshold 312 of FIG. 3, and the upper read threshold 314 of FIG. 3. can be determined by comparing the bit error rate 216 for multiple descending values of threshold voltages 704 for each of the read thresholds. The optimum value for the threshold voltages 704 can be detected when the bit error rate 216 of one of the threshold voltages 704 is higher than the bit error rate 216 of the previous one of the threshold voltages 704.

In an illustrative example, the threshold voltages 704 can include a first test voltage, a second test voltage, a third test voltage, and a fourth test voltage. Each of the test voltages can have a corresponding one of the bit error rate 216. The bit error rate 216 can include a first BER level, a second BER level, a third BER level, and a fourth BER level.

The first BER level can be determined at the first test voltage, which is lower than the current read thresholds 307 of FIG. 3. If the first BER level is higher than the current value of the bit error rate 216, then the current read thresholds 307 are a more accurate value and testing can be stopped. If the first BER level is lower than the current value of the bit error rate 216, then testing can continue and the second test voltage can be tested.

The second BER level can be determined at the second test voltage. If the second BER level is higher than the first BER level, then the adjusted read thresholds 306 of FIG. 3 can be set to the second test voltage value. If the second BER level is lower than the first BER level, then testing can continue and the third test voltage can be tested.

The third BER level can be determined at the third test voltage. If the third BER level is higher than the second BER level, then the adjusted read thresholds 306 can be set to the third test voltage value. If the third BER level is lower than the second BER level, then testing can continue and the fourth test voltage can be tested.

The fourth BER level can be determined at the fourth test voltage. If the fourth BER level is higher than the third BER level, then the local minimum has been determined and the adjusted read thresholds 306 can be set to the third test voltage value.

Figure 8:
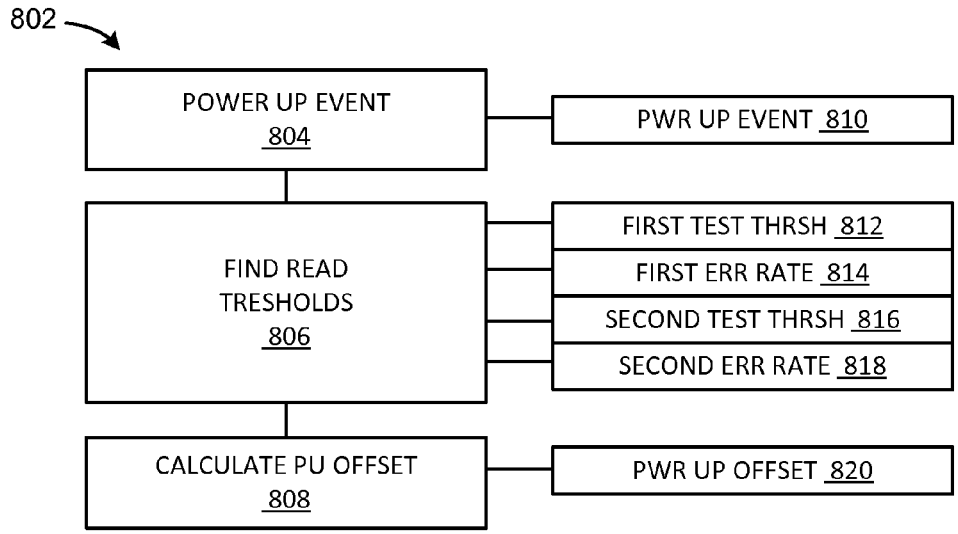
FIG. 8 is an example of a power up process.

Referring now to FIG. 8, therein is shown an example of a power up process 802. The power up process 802 can determine a power up offset 820 that can be used to modify the lower read threshold 310 of FIG. 3, the middle read threshold 312 of FIG. 3, or the upper read threshold 314 of FIG. 3 when the data storage system 100 of FIG. 1 is powered up.

The power up process 802 can include a power up event module 804, a find read thresholds module 806, and a calculate power up offset module 808. The power up process 802 can be implemented as the software 122 of FIG. 1 executing on the control unit 110 of FIG. 1.

The power up offset 820 can be implemented in a variety of ways. For example, the power up offset 820 can be a single offset value for all of the read thresholds. In another example, the power up offset 820 can be an array value having a different value for each of the read thresholds.

The power up event module 804 can detect the occurrence of a power up event 810. The power up event 810 occurs when electrical power is applied to the data storage system 100, such as when the data storage system 100 is plugged into the host device 140 of FIG. 1.

The detect power up event module 804 can detect the power up event 810 in a variety of ways. For example, the detect power up event module 804 can be included in the boot sequence of the data storage system 100. In another example, the detect power up event module 804 can be coupled to dedicated electronic hardware that can be trigged by the application of power to the data storage device. In yet another example, the power up event module 804 can be executed by a system interrupt, or other system level exception of the data storage system 100. After detecting the power up event 810, the control flow can pass to the find read thresholds module 806.

The find read thresholds module 806 can test a descending series of the threshold voltages and evaluate the bit error rate 216 of FIG. 2 for each of the read thresholds. The power up adaptation graph 702 of FIG. 7 shows the descending series of threshold voltages 704 of FIG. 7 being tested. When one of the threshold voltages 704 produces the bit error rate 216 that is higher than the value of the bit error rate 216 of the previous one of the threshold voltages 704, then the find read thresholds module 806 can assign the power up offset 820 based on the previous one of the threshold voltages 704.

The descending series of the threshold voltages 704 can be calculated in a variety of ways. For example, the series can be calculated using pre-determined intervals retrieved from the controller database 124 of FIG. 1. In another example, the series can be calculated dynamically based on the memory element age 504 of FIG. 5. In yet another example, the series can be calculated by first reading one of the read thresholds, such as the middle read threshold 312, and calculating the descending series based on the value of the middle read threshold 312.

The descending series of threshold voltages 704 is used because the read thresholds for move in a downward direction when stored in a power-off condition. The read thresholds become lower due to the partial reduction in the charge levels 320 of FIG. 3 over time as the electrical charge dissipates over time.

The find read thresholds module 806 can calculate the optimum values for the lower read threshold 310, the middle read threshold 312, and the upper read threshold 314. The optimum values for the read thresholds are the values of the threshold voltages 704 that result in the lowest value for the bit error rate 216.

In an illustrative example, the find read thresholds module 806 can test a first test threshold 812 to determine a first error rate 814, such as the bit error rate 216. The first test threshold 812 has a given value of the voltage levels 322 of FIG. 3. Testing can include reading one of the memory pages 202 of FIG. 2 using the first test threshold 812 and detecting the bit error rate 216.

The find read thresholds module 806 can then test a second test threshold 816 to determine a second error rate 818, such as the bit error rate 216. The second test threshold 816 has a lower value for the voltage levels 322 than the first test threshold 812. If the second error rate 818 is above the first error rate 814, then the first test threshold 812 can be used to determine the power up offset 820. After the find read thresholds module 806 has completed, the control flow can pass to the calculate power up offset module 808.

The calculate power up offset module 808 can calculate the power up offset 820 based on the first test threshold 812 and the second test threshold 816. The power up offset 820 is the value used to calculate the lower read threshold 310, the middle read threshold 312, and the upper read threshold 314.

The power up offset 820 can be calculated in a variety of ways. For example, the power up offset 820 can represent the actual value of the read thresholds for the lower read threshold 310, the middle read threshold 312, and the upper read threshold 314. In another example, the power up offset 820 can represent a value than can be added or subtracted from the current values of the read thresholds to determine the lower read threshold 310, the middle read threshold 312, and the upper read threshold 314. The power up offset 820 can represent the difference between a previous value for the read thresholds and the newly calculated value for the read thresholds. The power up offset 820 can be used to modify the read thresholds for reading one of the memory pages 202.

It has been discovered the modifying the lower read threshold 310, the middle read threshold 312, and the upper read threshold 314 by detecting the power up event 810 increases data quality. Compensating for charge loss during power off intervals reduces the number of read errors and increases data quality.

It has been discovered the modifying the lower read threshold 310, the middle read threshold 312, and the upper read threshold 314 by searching in a single downward direction reduces system overhead. Because charge dissipation during power off intervals, the change in the read thresholds results in lower read threshold, so searching downward identifying the power up offset 820 with less delay and less overhead, resulting in improved performance.

It has been discovered that modifying the lower read threshold 310, the middle read threshold 312, and the upper read threshold 314 on power up improves read accuracy by adjusting the read thresholds based on the likelihood of charge dissipation during the powered-off storage of the data storage system 100. Because of the indeterminate nature of the duration of the power-off period, retesting the read thresholds at power-up time can reduce the number of errors by compensating the time-based charge decay.

Figure 9:
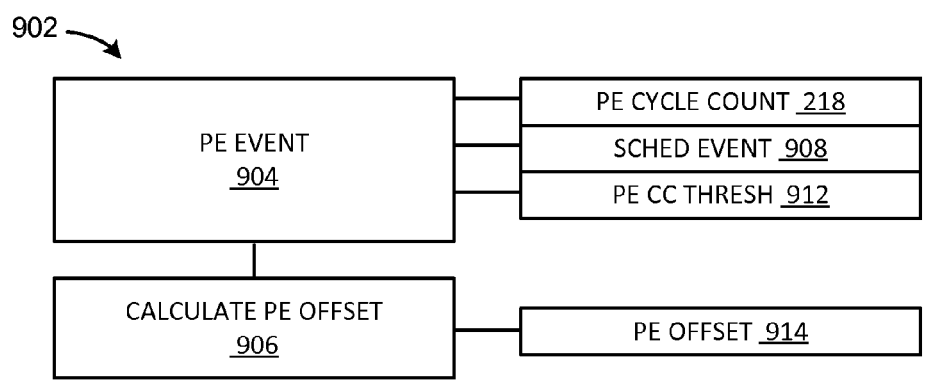
FIG. 9 is an example of a program erase cycle count schedule process.

Referring now to FIG. 9, therein is shown an example of a program erase cycle count schedule process 902. The program erase cycle count schedule process 902 can modify the lower read threshold 310 of FIG. 3, the middle read threshold 312 of FIG. 3, and the upper read threshold 314 of FIG. 3 based on the program erase cycle count 218.

The program erase cycle count schedule process 902 can include a program erase event module 904 and a calculate program erase offset module 906. The program erase cycle count schedule process 902 can be implemented as the software 122 of FIG. 1 executing on the control unit 110 of FIG. 1.

The program erase event module 904 can detect a scheduling event 908, such as a program erase cycle threshold reached event, when the program erase cycle count 218 meets or exceeds a program erase cycle count threshold 912. The program erase event module 904 can test the program erase cycle count 218 every time one of the memory blocks 204 of FIG. 2 has been erased in preparation for writing. The scheduling event 908 can indicate that the read thresholds, such as the lower read threshold 310, the middle read threshold 312, and the upper read threshold 314, should be modified.

The scheduling event 908 can be detected in a variety of ways. For example, the program erase cycle count threshold 912 can be set for 32, 100, or any other number of program erase cycles.

The program erase event module 904 can be implemented in a variety of ways. For example, the scheduling event 908 can increase the priority of a scheduled task responsible for adjusting the read thresholds of the data storage system 100 of FIG. 1. After the program erase event module 904 has completed, the control flow can pass to the calculate program erase offset module 906.

The calculate program erase offset module 906 can calculate a program erase offset 914 after the scheduling event 908 has occurred based on the program erase cycle count 218. For example, the program erase offset 914 can be calculated as the program erase cycle count 218 multiplied by an adjustment factor.

The program erase offset 914 can be used to modify the lower read threshold 310, the middle read threshold 312, and the upper read threshold 314 in a variety of ways. For example, the lower read threshold 310, the middle read threshold 312, and the upper read threshold 314 can be modified by adding the program erase offset 914 to the current read thresholds 307 of FIG. 3.

It has been found that determining how often to measure and adjust the read thresholds, such as the lower read threshold 310, the middle read threshold 312, and the upper read threshold 314, can increase performance and reduce data errors. Defining an a priori memory characterization provides a proposed frequency of adjustment based on the rate that thresholds move with the increase in the program erase cycle count 218. The read thresholds can change based on the number of program erase cycles experienced by one of the memory blocks 204.

It has been found that periodic adjustments of the read thresholds scheduled with all the other activity of the data storage system 100 can increase data reliability. Updating the read thresholds of the data storage system 100 improves the accuracy of read operations. Although the program erase cycle counts are not hard limits, they instead describe intervals where the priority of adapting the read thresholds increase.

It has been discovered that scheduling a task for modifying the lower read threshold 310, the middle read threshold 312, and the upper read threshold 314 based on the program erase cycle count 218 can increase data quality. Scheduling the modification of the adjusted read thresholds 306 of FIG. 3 based on the level of wear of the flash memory devices reduces the bit error rate 216 of FIG. 2 and improves data quality.

Figure 10:
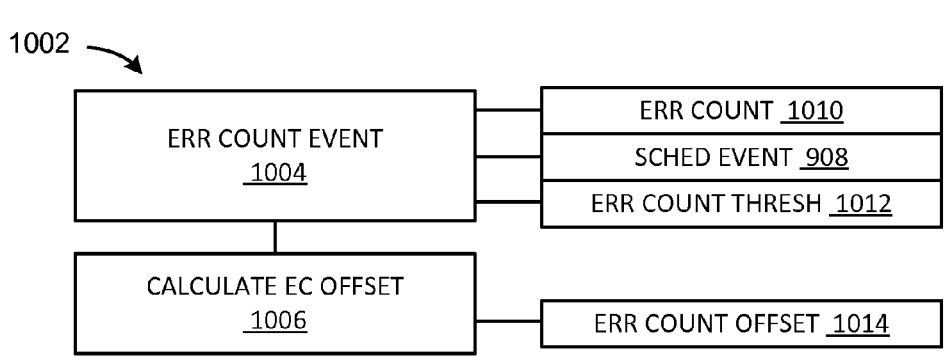
FIG. 10 is an example of an error count schedule process.

Referring now to FIG. 10, therein is shown an example of an error count schedule process 1002. The error count schedule process 1002 can modify the adjusted read thresholds 306 of FIG. 3 based on the number of uncorrectable errors detected in the error correction code unit 112 of FIG. 1.

The error count schedule process 1002 can include an error count event module 1004 and a calculate error count offset module 1006. The error count schedule process 1002 can be implemented as the software 122 of FIG. 1 executing on the control unit 110 of FIG. 1.

The error count event module 1004 can detect the scheduling event 908, such as the error count exceeded event, when an error count 1010 meets or exceeds an error count threshold 1012. The error count 1010 is the number of errors detected by the error correction code unit 112 of FIG. 1. The error count 1010 can be incremented each time uncorrectable errors are detected during the read operation.

The scheduling event 908 can be detected in a variety of ways. For example, the scheduling event 908 can be triggered based on a value of the error count threshold 1012 retrieved from the controller database 124 of FIG. 1. In another example, the error count threshold 1012 can be a pre-defined value, such as the correctable ECC limit. After the error count event module 1004 has completed, the control flow can pass to the calculate error count offset module 1006.

The calculate error count offset module 1006 can calculate an error count offset 1014 based after the scheduling event 908 has occurred based on the error count threshold 1012. For example, the error count offset 1014 can be calculated by retrieving the pre-defined value of the error count offset 1014 from the controller database 124 of FIG. 1.

The error count offset 1014 can be used to modify the adjusted read thresholds 306 in a variety of ways. For example, the adjusted read thresholds 306 can be modified by adding the error count offset 1014 to the current read thresholds 307 of FIG. 3.

When a read operation produces ECC errors exceeding the correctable ECC threshold, the data storage system 100 of FIG. 1 generates read retries. During the read retries, the data storage system takes extra measurements of the read thresholds and schedules the measurements at a high priority to allow the memory elements causing retries to have a larger impact on the read thresholds for that group of memory elements sharing similar thresholds.

It has been discovered that modifying the lower read threshold 310 of FIG. 3, the middle read threshold 312 of FIG. 3, and the upper read threshold 314 of FIG. 3, can increase speed and performance. The memory elements requiring read retries to avoid uncorrectable ECC errors dramatically reduce read throughput for the data storage system 100 because multiple read operations are required to obtain the data that could have been determined on a single read operation. By giving read-retries priority feedback and over-weighted impact on read threshold settings, the data storage system 100 can quickly adapt read thresholds to voltage threshold values that reduce the number of the read retries and dramatically improve the SSD performance.

It has been discovered that modifying the lower read threshold 310, the middle read threshold 312, and the upper read threshold 314, based on the error count 1010 increases data quality and reduces overhead. Modifying the read thresholds based on detected bit errors reduces the bit error rate 216 of FIG. 2 and provides a higher level of data quality. By reducing the bit error rate 216, the overall system overhead is reduced.

Figure 11:
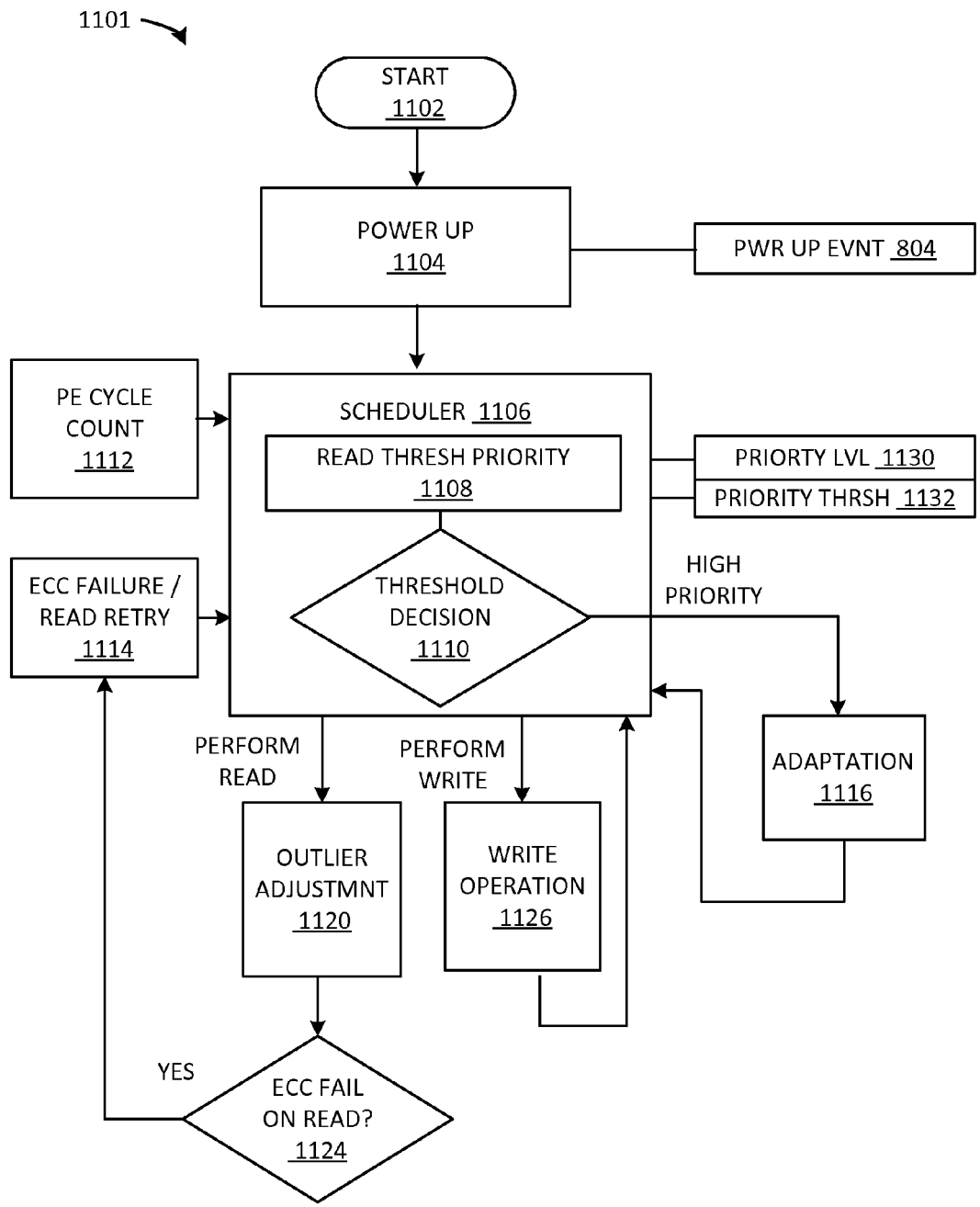
FIG. 11 is an example of a read threshold adjustment process.

Referring now to FIG. 11, therein is shown an example of a read threshold adjustment process 1101. The read threshold adjustment process 1101 can modify the adjusted read thresholds 306 of FIG. 3 of the data storage system 100 of FIG. 1 to minimize the bit error rate 216 of FIG. 2.

The read threshold adjustment process 1101 can be implemented as the software 122 of FIG. 1 executing on the control unit 110 of FIG. 1. The read threshold adjustment process 1101 can be implemented as the software 122 of FIG. 1 executing on the control unit 110 of FIG. 1.

In a start module 1102, the data storage system 100 can receive power in preparation for operation. After powering up, the control flow can pass to the start module 1102.

In a power up module 1104, the data storage system 100 can detect the power up event 804 and can then test and modify the adjusted read thresholds 306, such as the lower read threshold 310 of FIG. 3, the middle read threshold 312 of FIG. 3, and the upper read threshold 314 of FIG. 3. The power up module 1104 can include the power up process 802 of FIG. 8. After the power up module 1104 has completed, the control flow can pass to a scheduler module 1106.

In the scheduler module 1106, the data storage system 100 can evaluate read threshold priorities and determine whether to modify the adjusted read thresholds 306 of the data storage system 100. The scheduler module 1106 can include a read threshold priority module 1108 and a threshold decision module 1110.

The scheduler module 1106 can maintain and schedule a list of tasks. For example, the scheduler module 1106 can manage read operations, write operations, adaptation operations, or a combination thereof. The scheduler module 1106 can manage the list by executing the tasks in priority order from the highest priority task on the list to the lowest priority task.

In the read threshold priority module 1108, the data storage system 100 can determine a priority level 1130 of the read threshold adjustment operations. The priority level 1130 is a value indicating whether a read threshold adjustment operation should occur. For example, the priority level 1130 can indicate that a read threshold adjustment operations should occur if the priority level 1130 is above a priority threshold 1132. In another example, the priority level 1130 can indicate that the read threshold adjustment operation should occur if the priority level 1130 is above zero.

The priority level 1130 can be calculated in a variety of ways. For example, the priority level 1130 can be based on the total number of program erase cycles for one of the memory blocks 204 of FIG. 2, the error rate, the memory element age 504 of FIG. 5, or a combination thereof.

In the threshold decision module 1110, the priority level 1130 can be compared to the priority threshold 1132 to determine if the read threshold adjustment operation should be initiated. If the priority level 1130 is greater than or equal to the priority threshold 1132, then the data storage system can pass the control flow to an adaptation module 1116.

If the priority level is less than the priority threshold 1132, then the control flow can pass to different modules depending on the operation the data storage system 100 is performing. If the data storage system 100 is performing a read operation, then the control flow can pass to an outlier adjustment module 1120. If the data storage system 100 is performing a write operation, then the control flow can pass to a write module 1126.

In a program erase cycle count module 1112, the data storage system 100 can maintain a count of each program and erase cycle for each of the memory blocks 204. The program erase cycle count 218 of FIG. 2 can be incremented each time one of the memory blocks 204 is erased. The program erase cycle count 218 can be used by the read threshold priority module 1108 to calculate the priority level 1130.

In the outlier adjustment module 1120, the data storage system 100 can lookup the current read thresholds 307 of FIG. 3, determine the outlier adjustment, modify the adjusted read thresholds 306, and read the data from one of the memory pages 202 of FIG. 2, and then the control flow can pass to an ECC decision module 1124.

To perform the read operation, the data storage system 100 can calculate the change in the adjusted read thresholds 306 in the outlier adjustment module 1120. In the outlier adjustment module 1120, the data storage system 100 can retrieve the outlier block offset 620 of FIG. 6 from the controller database 124 of FIG. 1.

The adjusted read thresholds 306 can be calculated in a variety of ways. For example, the adjusted read thresholds 306 can be calculated by multiplying the memory element age 504 and the outlier block offset 620 and subtracting that value from the current read thresholds 307.

After the adjusted read thresholds 306 has been calculated, the read operation can be performed with the adjusted read thresholds 306 and the result of the read operation can be checked with the error correction code unit 112 of FIG. 1 of the data storage system 100.

In the ECC decision module 1124, the status of the read operation can be checked to determine if an uncorrectable error occurred during the read operation. If no error was detected, then the control flow can pass back to scheduler module. If the uncorrectable error occurred, then the control flow can pass to an ECC failure read retry module 1114.

In the ECC failure read retry module 1114, the data storage system 100 can save feedback from the read operation and record the uncorrectable error. When the read operation has encountered errors exceeding the correctable ECC limit, the data storage system 100 performs a retry operation. During the retry operation, the data storage system takes extra read-threshold measurements scheduled at a high priority to allow the memory elements causing the retry operation to have a larger impact on the read thresholds for that group of memory elements sharing similar thresholds.

Memory elements requiring read retries to avoid uncorrectable ECC errors dramatically reduce read throughput on the data storage system 100 because multiple read operations are required to obtain the data that could have been determined on a single read. By giving read-retries priority feedback and over-weighted impact on read threshold settings, the data storage system can quickly modify the adjusted read thresholds 306 to values that reduce the number of read retry operations, and dramatically improve the performance of the data storage system 100. After the ECC failure read retry module 1114 has completed, the control flow can pass back to the scheduler module 1106.

To perform the write operation, the data storage system 100 can perform the write module 1126. In the write module 1126, the data can be written to one of the memory pages 202. After completing the write operation, the control flow can pass back to the scheduler module 1106.

In the adaptation module 1116, the data storage system 100 can perform the current read threshold process 502 of FIG. 5 to determine the memory element age 504 and the lower read threshold 310, the middle read threshold 312, and the upper read threshold 314. The current read threshold process 502 of FIG. 5 can calculate the lower read threshold 310 and the upper read threshold 314 based on the memory element age 504 and the middle read threshold 312. After completing the adaptation module 1116, the control flow can pass back to the scheduler module 1106.

It has been discovered that modifying the adjusted read thresholds 306 to adapt to charge loss during the power off state increases data quality. By evaluating the change in the read thresholds based on the program erase cycle count 218, the bit error rate 216 is reduced and data quality increased.

It has been discovered that scheduling a task for modifying the adjusted read thresholds 306 based on the error count 1010 of FIG. 10 can increase data quality. Scheduling the modification of the adjusted read thresholds 306 based on detected bit errors reduces the bit error rate 216 and provides a higher level of data quality.

Figure 12:
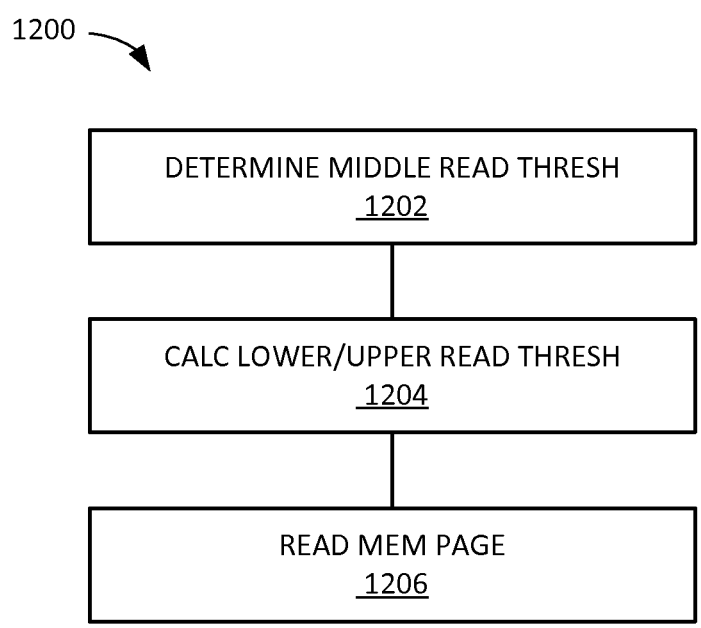
FIG. 12 is a flow chart of a method of operation of the data storage system in a further embodiment of the present invention.

Referring now to FIG. 12, therein is shown a flow chart of a method 1200 of operation of the data storage system 100 of FIG. 1 in a further embodiment of the present invention. The method 1200 includes: determining a middle read threshold for a memory die in a block 1202; calculating a lower read threshold and an upper read threshold based on the middle read threshold and a memory element age in a block 1204; reading a memory page of the memory die using the lower read threshold, the middle read threshold, or the upper read threshold for compensating for a charge variation in a block 1206.

Thus, it has been discovered that the data storage system of the present invention furnishes important and heretofore unknown and unavailable solutions, capabilities, and functional aspects for a data storage system with dynamic read threshold mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a data storage system comprising:
   determining a middle read threshold for a memory die;
   calculating a lower read threshold and an upper read threshold based on the middle read threshold and a memory element age; and
   reading a memory page of the memory die using the lower read threshold, the middle read threshold, or the upper read threshold for compensating for a charge variation.

2. The method as claimed in claim 1 further comprising:
   retrieving a die read threshold from a controller database;
   calculating an outlier block offset for an outlier block based on the location of the outlier block; and
   modifying the lower read threshold, the middle read threshold, and the upper read threshold with the outlier block offset.

3. The method as claimed in claim 1 further comprising:
   retrieving a die read threshold from a controller database;
   calculating an outlier page offset for an outlier page based on the location of the outlier page; and
   modifying the lower read threshold, the middle read threshold, and the upper read threshold with the outlier page offset.

4. The method as claimed in claim 1 further comprising modifying the lower read threshold, the middle read threshold, and the upper read threshold based on a retention time.

5. The method as claimed in claim 1 further comprising modifying the lower read threshold, the middle read threshold, and the upper read threshold based on a read disturb count.

6. A method of operation of a data storage system comprising:
   determining a middle read threshold for a memory die;
   determining a memory element age for the memory die;
   calculating a lower read threshold and an upper read threshold based on the middle read threshold and the memory element age; and
   reading a memory page of the memory die using the lower read threshold, the middle read threshold, or the upper read threshold for compensating for a charge variation.

7. The method as claimed in claim 6 further comprising:
   detecting a power up event;
   detecting a first test threshold having a bit error rate after detecting the power up event;
   detecting a second test threshold having another of the bit error rate greater than the bit error rate of the first test threshold, the second test threshold lower than the first test threshold;

determining a power up offset for a memory die based on the first test threshold; and modifying the lower read threshold, the middle read threshold, or the upper read threshold based on the power up offset.

8. The method as claimed in claim 6 further comprising:

detecting a scheduling event based on a program erase cycle count meeting or exceeding a program erase cycle count threshold; and in accordance with detection of the scheduling event:
calculating a program erase offset based on the program erase cycle count; and
modifying the lower read threshold, the middle read threshold, or the upper read threshold based on the program erase offset.

9. The method as claimed in claim 6 further comprising:

detecting a scheduling event based on an error count meeting or exceeding an error count threshold; and in accordance with detection of the scheduling event:
calculating an error count offset based on the error count; and
modifying the lower read threshold, the middle read threshold, or the upper read threshold based on the error count offset.

10. The method as claimed in claim 6, including setting the memory element age to a program erase cycle count.

11. A data storage system comprising:
a memory die;
a controller, coupled to the memory die controlling operation of the data storage system, the controller including:
a mapping module for determining a middle read threshold for the memory die;
one or more modules for calculating a lower read threshold and an upper read threshold based on the middle read threshold and a memory element age; and
a memory interface, coupled to the memory die, for reading a memory page of the memory die using the lower read threshold, the middle read threshold, or the upper read threshold for compensating for a charge variation.

12. The system as claimed in claim 11, wherein the controller further comprises:
a controller database for retrieving a die read threshold; and
an outlier block adjustment module, coupled to the control unit, for calculating an outlier block offset for an outlier block based on the location of the outlier block and for modifying the lower read threshold, the middle read threshold, or the upper read threshold with the outlier block offset.

13. The system as claimed in claim 11, wherein the controller further comprises:
a controller database for retrieving a die read threshold; and
an outlier page adjustment module for calculating an outlier page offset for an outlier page based on the location of the outlier page and for modifying the lower read threshold, the middle read threshold, or the upper read threshold with the outlier page offset.

14. The system as claimed in claim 11 wherein the lower read threshold, the middle read threshold, or the upper read threshold are modified based on a retention time.

15. The system as claimed in claim 11 wherein the lower read threshold, the middle read threshold, or the upper read threshold are modified based on a read disturb count.

16. The system as claimed in claim 11, wherein the controller further comprises a module for retrieving the memory element age of the memory die.

17. The system as claimed in claim 16, wherein the controller further comprises:
a power up event module for detecting a power up event;
a find read thresholds module, coupled to the power up event module, for detecting a first test threshold having a bit error rate and for detecting a second test threshold having another of the bit error rate greater than the bit error rate of the first test threshold with the second test threshold lower than the first test threshold; and
a calculate power up offset module, coupled to the find read thresholds module, for determining a power up offset for the memory die based on the first test threshold and for modifying the lower read threshold, the middle read threshold, or the upper read threshold based on the power up offset.

18. The system as claimed in claim 16, wherein the controller further comprises:
a program erase event module for detecting a scheduling event based on a program erase cycle count meeting or exceeding a program erase cycle count threshold; and
a calculate program erase offset module, coupled to the program erase event module, for calculating a program erase offset based on the program erase cycle count and for modifying the lower read threshold, the middle read threshold, or the upper read threshold based on the program erase offset.

19. The system as claimed in claim 16, wherein the controller further comprises:
an error count event module for detecting a scheduling event based on an error count meeting or exceeding an error count threshold; and
an calculate error count offset module, coupled to the error count event module, for calculating an error count offset based on the error count and for modifying the lower read threshold, the middle read threshold, or the upper read threshold based on the error count offset.

20. The system as claimed in claim 16, wherein the controller further comprises an initial mapping module for setting the memory element age to the program erase cycle count.

* * * * *

UNITED STATES PATENT AND TRADEMARK OFFICE
CERTIFICATE OF CORRECTION

PATENT NO. : 9,146,850 B2
APPLICATION NO. : 13/957407
DATED : September 29, 2015
INVENTOR(S) : Fitzpatrick et al.

Page 1 of 1

It is certified that error appears in the above-identified patent and that said Letters Patent is hereby corrected as shown below:

In the claims,

Claim 6, col. 20, line 53, please delete "determining a memory" and insert --retrieving a memory--;

Claim 11, col. 21, line 29, please delete "die controlling" and insert --die for controlling--;

Claim 19, col. 22, line 44, please delete "an calculate error" and insert --a calculate error--.

Signed and Sealed this
Twenty-second Day of March, 2016

Michelle K. Lee
*Director of the United States Patent and Trademark Office*